(12) United States Patent
Park et al.

(10) Patent No.: US 7,427,740 B2
(45) Date of Patent: Sep. 23, 2008

(54) IMAGE SENSOR WITH DRAIN REGION BETWEEN OPTICAL BLACK REGIONS

(75) Inventors: Sun-Yong Park, Seoul (KR); Jun-Taek Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 40 days.

(21) Appl. No.: 11/333,886

(22) Filed: Jan. 18, 2006

(65) Prior Publication Data

US 2006/0175535 A1 Aug. 10, 2006

(30) Foreign Application Priority Data

Feb. 7, 2005 (KR) .................... 10-2005-0011455

(51) Int. Cl.
*H01L 31/00* (2006.01)

(52) U.S. Cl. ............... 250/214.1; 250/208.1; 348/243; 348/245; 257/445; 257/223; 257/230

(58) Field of Classification Search ............... 257/223, 257/230, 445; 250/208.1, 214.1; 348/314, 348/243, 245
See application file for complete search history.

(56) References Cited

U.S. PATENT DOCUMENTS

| | | | | |
|---|---|---|---|---|
| 5,519,207 A | * | 5/1996 | Morimoto | 250/208.1 |
| 5,521,639 A | * | 5/1996 | Tomura et al. | 348/243 |
| 5,903,021 A | * | 5/1999 | Lee et al. | 257/292 |
| 6,465,859 B1 | * | 10/2002 | Fujiwara et al. | 257/435 |
| 6,614,473 B1 | * | 9/2003 | Kijima | 348/243 |
| 6,744,526 B2 | * | 6/2004 | McDermott et al. | 358/1.11 |
| 6,803,960 B2 | * | 10/2004 | Shepherd et al. | 348/315 |
| 7,002,231 B2 | * | 2/2006 | Rhodes et al. | 257/446 |
| 2004/0079865 A1 | * | 4/2004 | Hoshi | 250/214.1 |
| 2006/0011813 A1 | * | 1/2006 | Park et al. | 250/208.1 |
| 2006/0012838 A1 | * | 1/2006 | Ovsiannikov | 358/512 |
| 2006/0092305 A1 | * | 5/2006 | Baba et al. | 348/311 |

FOREIGN PATENT DOCUMENTS

JP 59072164 A * 4/1984

\* cited by examiner

*Primary Examiner*—Stephen Yam
(74) *Attorney, Agent, or Firm*—F. Chau & Associates, LLC

(57) ABSTRACT

An image sensor comprises an active pixel region that includes a plurality of unit pixels arranged in a matrix pattern, a first optical black region formed adjacent to the active pixel region, wherein a plurality of shaded unit pixels are arranged therein, a drain region formed adjacent to the first optical black region, the drain region discharging excess electrons generated in the active pixel region, and a second optical black region formed adjacent to the drain region, wherein another plurality of the shaded unit pixels are arranged therein.

34 Claims, 10 Drawing Sheets

IMAGE SENSOR WITH DRAIN REGION BETWEEN OPTICAL BLACK REGIONS

CROSS-REFERENCE TO RELATED APPLICATION

This application claims priority to Korean Patent Application No. 10-2005-0011455 filed on Feb. 7, 2005, the disclosure of which is incorporated herein by reference in its entirety.

BACKGROUND OF THE INVENTION

1. Technical Field

The present disclosure relates to an image sensor, and more particularly, to an image sensor that is capable of producing a stable reference signal.

2. Discussion of the Related Art

Image sensors convert optical information into an electrical signal. Image sensors are used in connection with, for example, digital cameras, camcorders, personal computers (PCs), game devices, security cameras, micro-cameras for medical use, and robots.

An image sensor includes an active pixel region and an optical black region. In the active pixel region, a plurality of unit pixels are arranged in a matrix pattern. The unit pixels convert incident light into an image signal. The optical black region is formed adjacent to the active pixel region. The optical black region provides a constant reference signal regardless of the incident light, and includes a plurality of shaded unit pixels. In particular, the optical black region prevents a level of the image signal from varying according to temperature changes. For example assuming that a voltage level of the reference signal is related to ambient temperature, a difference between a voltage level of the image signal and that of the reference signal is calculated using a signal generated by the incident light.

However, when high intensity light is incident on the active pixel region, in particular, around the periphery of the optical black region, excess electrons generated by a photoelectric converter of a unit pixel overflow to the shaded unit pixels in the optical black region, thereby distorting the reference signal. When the distorted reference signal is used, the difference between the voltage level of the image signal and that of the reference signal becomes smaller than when a normal reference signal is used. As a result, image quality is reduced.

SUMMARY OF THE INVENTION

Embodiments of the present invention provide an image sensor that is capable of producing a stable reference signal.

According to an embodiment of the present invention, an image sensor comprises an active pixel region including a plurality of unit pixels arranged in a matrix pattern, a first optical black region formed adjacent to the active pixel region, and including a plurality of first optical black region shaded unit pixels are arranged therein, a drain region formed adjacent to the first optical black region, the drain region discharging excess electrons generated in the active pixel region, and a second optical black region formed adjacent to the drain region, and including a plurality of second optical black region shaded unit pixels are arranged therein.

According to another embodiment of the present invention, an image sensor comprises an active pixel region including a plurality of unit pixels formed on a semiconductor substrate, a first optical black region formed adjacent to the active pixel region, a drain region formed adjacent to the first optical region, and a second optical black region formed adjacent to the drain region.

BRIEF DESCRIPTION OF THE DRAWINGS

Preferred embodiments of the present disclosure can be understood in more detail from the following description taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may be embodied in many different forms and should not be construed as limited to the embodiments set forth herein.

Figure 1:
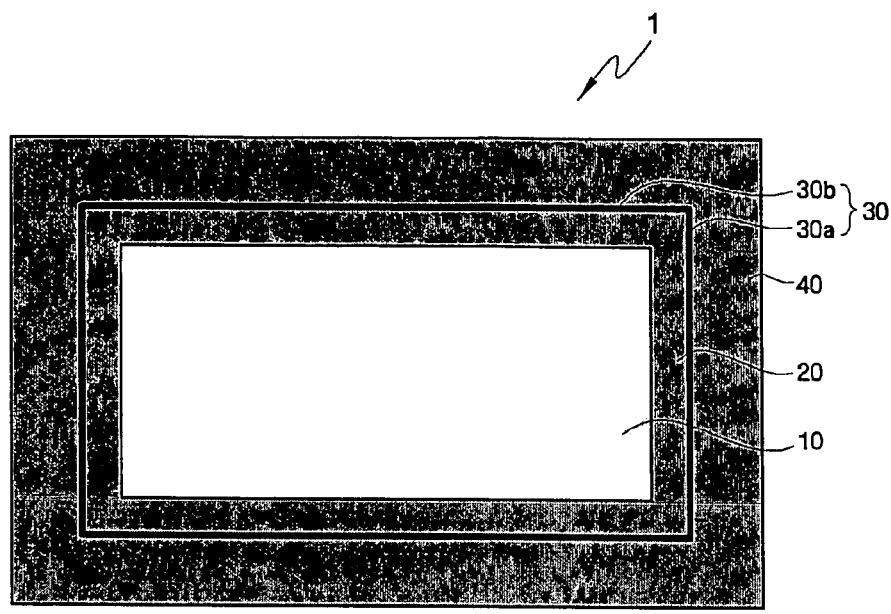
FIG. 1 illustrates a pixel arrangement unit of an image sensor according to an embodiment of the present invention.
Figure 2:
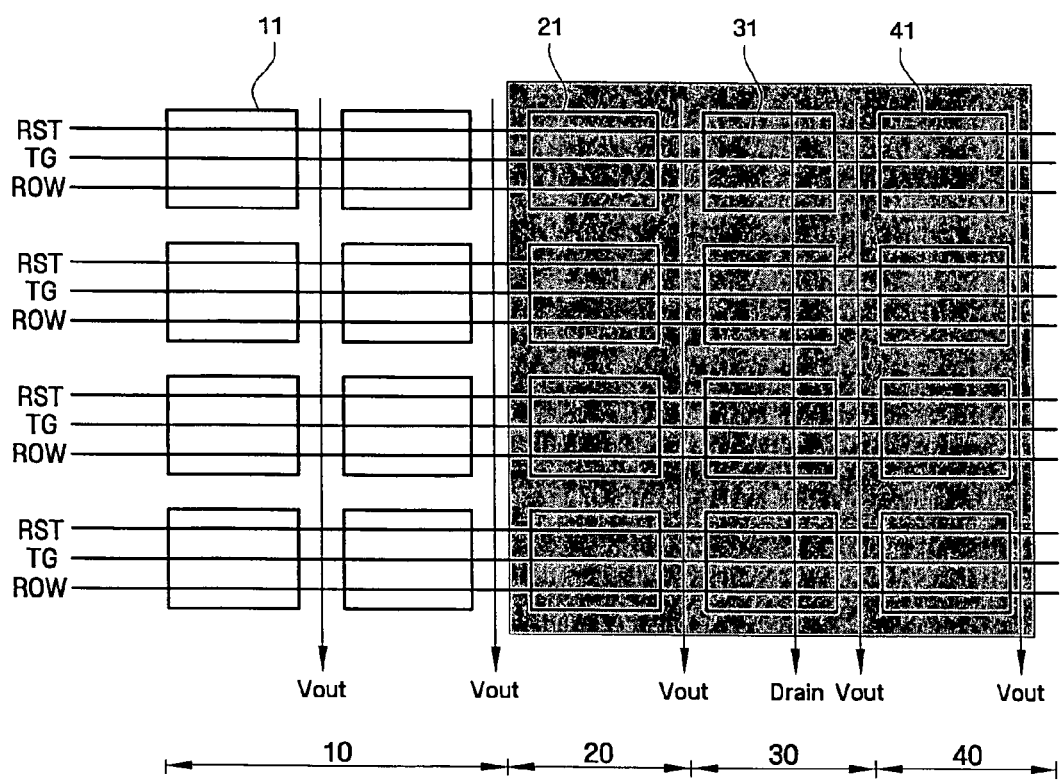
FIG. 2 is a diagram for illustrating an operation of the pixel arrangement unit of FIG. 1.
Figure 3:
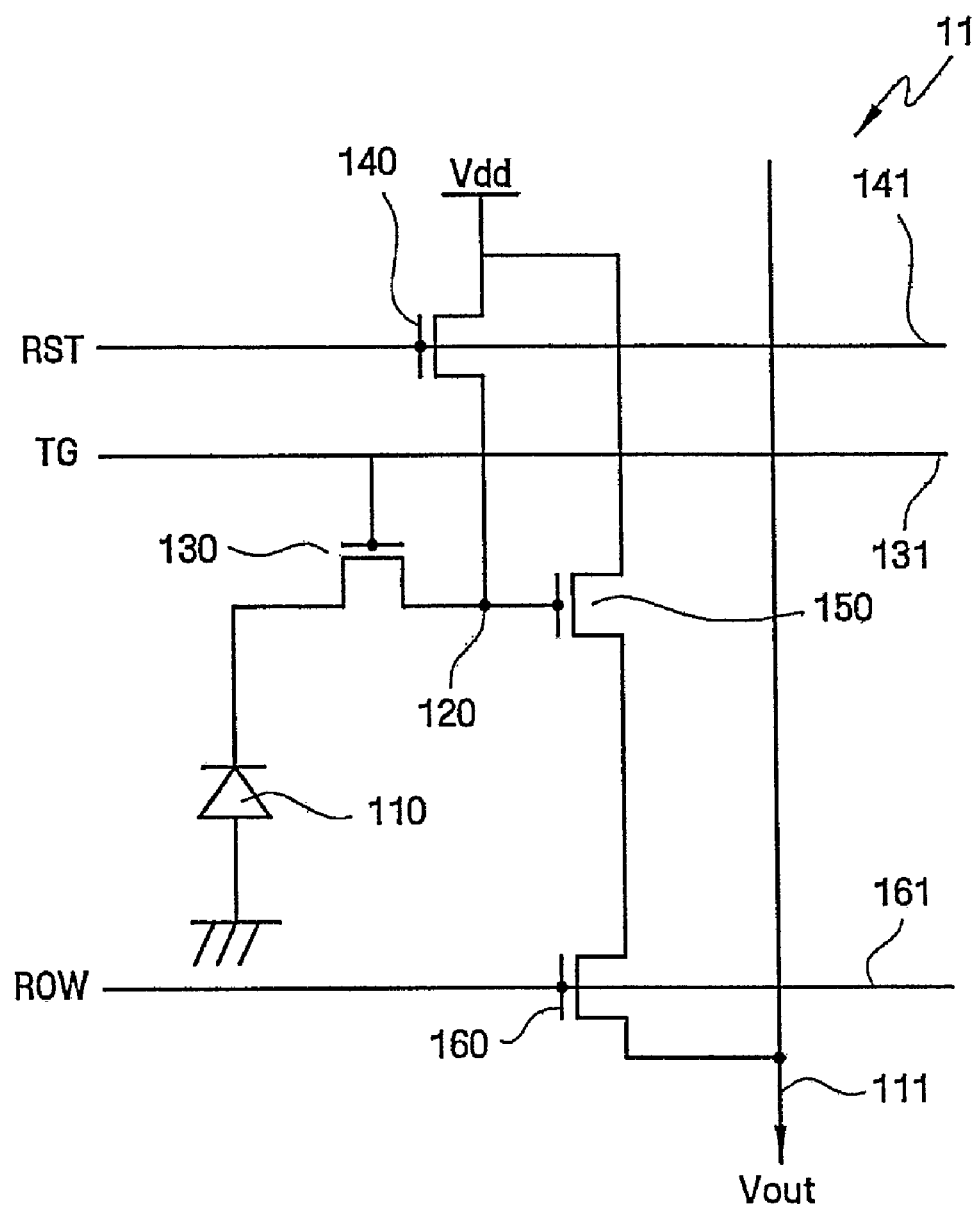
FIG. 3 is a circuit diagram of a unit pixel of an image sensor according to an embodiment of the present invention.

Image sensors according to embodiments of the present invention include a charge coupled device (CCD) image sensor and/or a complementary metal oxide semiconductor (CMOS) image sensor. FIG. 1 illustrates a pixel arrangement unit of an image sensor according to an embodiment of the present invention. FIG. 2 is a diagram for illustrating the operation of the pixel arrangement unit of FIG. 1. FIG. 3 is a circuit diagram of a unit pixel included in an image sensor.

Referring to FIGS. 1 and 2, a pixel arrangement unit 1 of an image sensor according to an embodiment of the present invention includes an active pixel region 10, a first optical black region 20, a drain region 30, and a second optical black region 40.

In the active pixel region 10, a plurality of unit pixels 11 photoelectrically converting incident light into an image signal Vout are arranged in a matrix pattern as illustrated in FIG. 2. The unit pixels 11 are driven by driving signals such as a pixel select signal ROW, a reset signal RST, and a charge transmission signal TG received from a row driver (not shown).

Referring to FIG. 3, each of the unit pixels 11 includes a photoelectric converter 110, a charge detector 120, a charge transmitter 130, a reset portion 140, an amplifier 150, and a selector 160. In an embodiment of the present invention, each of the unit pixels 11 includes four transistors as illustrated in FIG. 3. Alternatively, each of the unit pixels 11 may also include, for example, three or five transistors.

The photoelectric converter 110 absorbs incident light and accumulates an amount of electric charge corresponding to the amount of incident light. The photoelectric converter 110 may be, for example, a photodiode, a phototransistor, a photogate, a pinned photodiode (PPD), or a combination of the same.

The charge detector 120 includes a floating diffusion (FD) region and receives the electric charge accumulated in the photoelectric converter 110. Since the charge detector 120 includes a parasite capacitance, the electric charges are cumulatively stored in the charge detector 120. The charge detector 120 is electrically connected to a gate of the amplifier 150 and thus controls the amplifier 150.

The charge transmitter 130 transmits the electric charges from the photoelectric converter 110 to the charge detector 120. The charge transmitter 130 includes one transistor and is controlled by the charge transmission signal TG.

The reset portion 140 periodically resets the charge detector 120. A source of the reset portion 140 is connected to the charge detector 120, and a drain of the reset portion 140 is connected to the power supply voltage Vdd. The reset portion 140 operates in response to the reset signal RST.

The amplifier 150 functions as a source follower buffer amplifier in association with a constant current source (not shown) outside the unit pixels 11. A voltage that varies according to a voltage of the charge detector 120 is output from the amplifier 150 to a vertical signal line 111. A source of the amplifier 150 is connected to a drain of the selector 160, and a drain of the amplifier 150 is connected to the power supply voltage Vdd.

The selector 160 selects one of the unit pixels 11 to be read in units of rows. The selector 160 operates in response to the pixel select signal ROW, and a source of the selector 160 is connected to the vertical signal line 111.

Driving signal lines 131, 141 and 161 of the charge transmitter 130, the reset portion 140 and the selector 160, respectively, extend in a row (horizontal) direction such that the unit pixels 11 in a same row are driven simultaneously.

Referring back to FIGS. 1 and 2, the first optical black region 20 is formed adjacent to the active pixel region 10 and includes a plurality of shaded unit pixels 21. The first optical black region 20 may surround the active pixel region 10. In an embodiment of the present invention, the shaded unit pixels 21 are configured in substantially the same way as the unit pixels 11 of the active pixel region 10 described above. A metallic or polysilicon shading layer is formed on a top portion of a photoelectric converter included in each of the shaded unit pixels 21. The metallic or polysilicon shading layer blocks light from being incident on the photoelectric converter.

When high intensity light is incident on the active pixel region 10, excess electrons are generated by the photoelectric converter 110 in the active pixel region 10. Then, the excess electrons flow to the shaded unit pixels 21 of the first optical black region 20, which is adjacent to the active pixel region 10, and then flow to shaded unit pixels 31 of the drain region 30. According to an embodiment of the present invention, the characteristics of the image sensor can be estimated by analysis of an output signal of the first optical black region 20. For example, a correlation between intensity of incident light and excess electrons generated may be analyzed. The first optical black region 20 affected by the intensity of the incident light may be analyzed to estimate the effects of interference between pixels such as, for example, cross-talk or blooming characteristics.

The active pixel region 10 is separated by a predetermined distance from the second optical black region 40. The first optical black region 20 and the drain region 30 are interposed between the active pixel region 10 and the second optical black region 40. Therefore, when the excess electrons generated in the active pixel region 10 reach the drain region 30 via the first optical black region 20, the excess electrons are discharged through a positive voltage or the power supply voltage Vdd. Thus, there is a low probability that the excess electrons will reach the second optical black region 40.

The drain region 30 includes at least one surface adjacent to the first optical black region 20. The drain region 30 prevents excess electrons generated after high intensity light is incident on the active pixel region 10 from flowing into the second optical black region 40. The drain region 30 may surround the first optical black region 20, which in turn surrounds the active pixel region 10.

In an embodiment of the present invention, first drain regions 30a of the drain region 30 formed on both sides of the active pixel region 10 are parallel to a first direction (e.g., longitudinal as shown in FIG. 1) of the matrix pattern of the active pixel region 10, and second drain regions 30b of the drain region 30 formed on both sides of the active pixel region 10 are perpendicular to the first direction. The ends of the first drain regions 30a are connected to the ends of the second drain regions 30b.

The drain region 30 may be formed deeper than the first and second optical black regions 20 and 40. Electrons generated within a semiconductor substrate on which the image sensor is formed, as well as the excess electrons generated in the active pixel region 10, accumulate in the drain region 30 without flowing into photoelectric converters of shaded unit pixels 41.

As a result, due to excess electrons not flowing into the second optical black region 40, the second optical black region 40 provides a constant reference signal regardless of the intensity of incident light and prevents a level of the image signal Vout from varying according to temperature changes. In other words, a difference between a voltage level of the image signal Vout and that of the constant/non-distorted reference signal is calculated using a signal generated by the incident light. Consequently, a more accurate image signal can be generated through image signal processing. The second optical black region 40 is formed adjacent to the drain region 30 and includes the shaded unit pixels 41. The shaded unit pixels 41 arranged in the second optical black region 40 are configured to have the same structure as the shaded unit pixels 21 arranged in the first optical black region 20.

Figure 4:
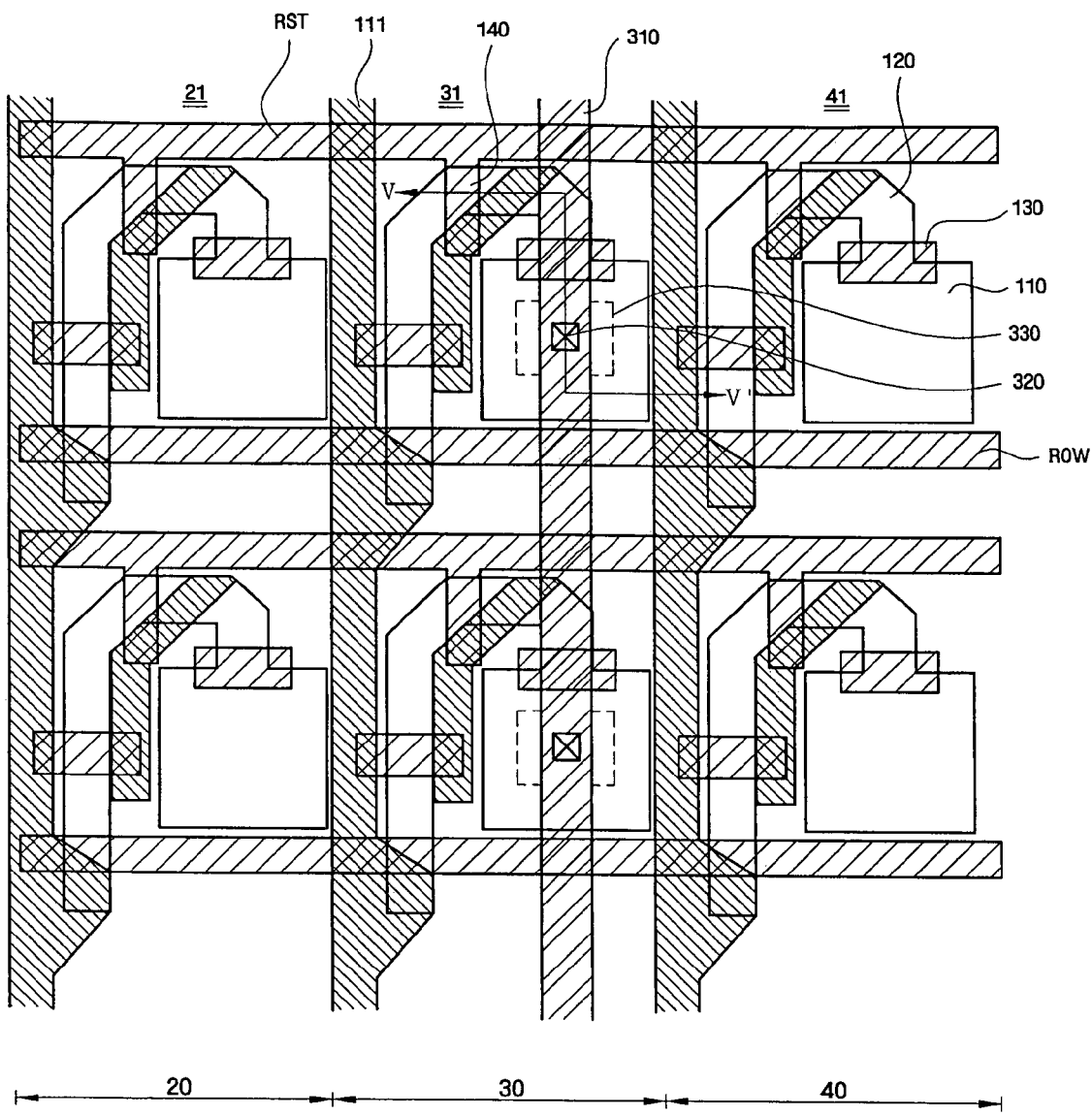
FIG. 4 is a layout diagram for illustrating a drain structure of an image sensor according to an embodiment of the present invention.
Figure 5:
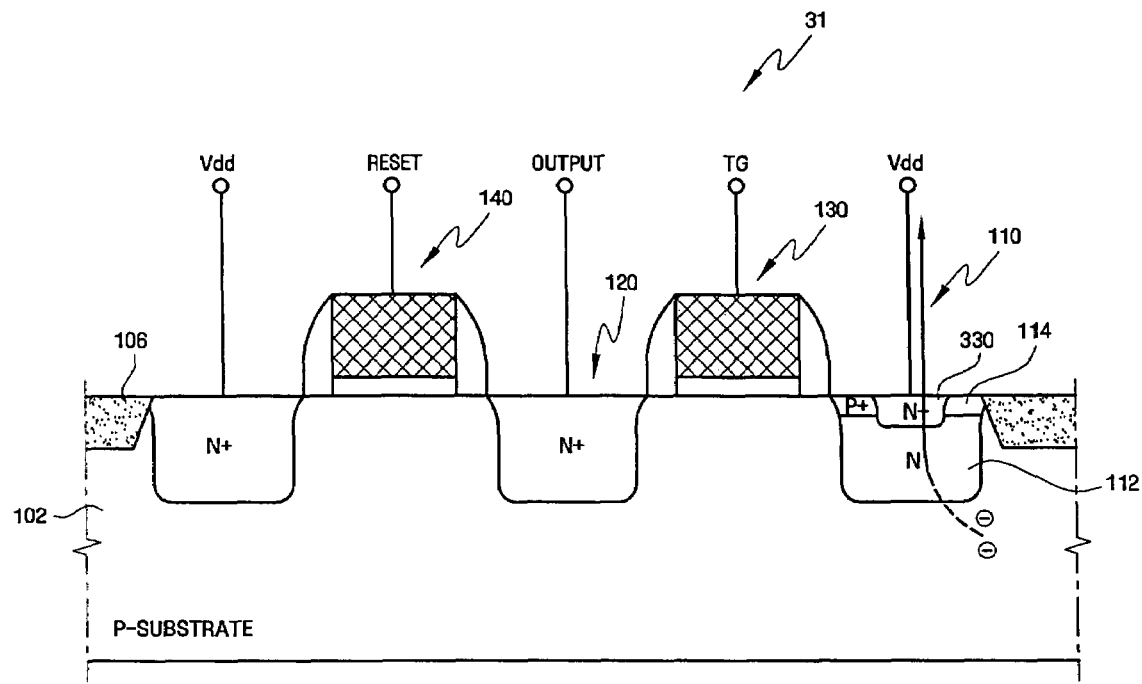
FIG. 5 is a cross-sectional view taken along line V-V' of FIG. 4 according to an embodiment of the present invention.

FIG. 4 is a layout diagram of a portion of the image sensor for illustrating a drain structure thereof. FIG. 5 is a cross-sectional view of the image sensor taken along the line V-V' of FIG. 4.

Referring to FIG. 4, the shaded unit pixels 21, 31, and 41 are respectively arranged in the first optical black region 20, the drain region 30, and the second optical black region 40 of the image sensor according to an embodiment of the present invention. In an embodiment of the present invention, the shaded unit pixels 31 in the drain region 30 differ from the shaded unit pixels 21 and 41 in the first and second optical black regions 20 and 40 in that a positive voltage line 310 is electrically connected to a photoelectric converter 110 included in each of the shaded pixel units 31.

Referring to FIGS. 4 and 5, a device separation region 106 is formed on a semiconductor substrate 102 and defines an area where the shaded unit pixels 31 are formed. The device isolation region 106 may be a field oxide (FOX) or shallow trench isolation region formed using a local oxidation of silicon (LOCOS) method. Each of the unit pixels 31 includes a charge transmitter 130 transmitting electric charges in the photoelectric converter 110 to a charge detector 120, and a reset portion 140 separated by a predetermined distance from the charge transmitter 130 and resetting the charge detector 120 to the power supply voltage Vdd.

In an embodiment of the present invention, the shaded unit pixels 31 are formed in the p-type semiconductor substrate 102. Alternatively, the shaded unit pixels 31 may be formed, for example, in a p-type well or a p-type epitaxial layer formed on the p-type (or n-type) semiconductor substrate 102.

According to an embodiment of the present invention, the photoelectric converter 110 is a pinned photodiode (PPD) including an n-type photodiode 112 accumulating electric charges corresponding to incident light, a $p^+$-type pinning layer 114 blocking dark current, and an $n^+$-type ohmic contact layer 330 enhancing contact characteristics between the positive voltage line 310 and the photoelectric converter 110.

The photodiode 112 is formed by ion-implanting n-type dopants into the semiconductor substrate 102. The pinning layer 114 is formed by ion-implanting a high dose of $p^+$-type dopants into an upper portion of the photodiode 112 at low energy. Thereafter, n+-type dopants are ion-implanted into the photodiode 112 to form the ohmic contact layer 330 that penetrates the pinning layer 114 and is connected to the photodiode 112.

An increase in the doping density of the ohmic contact layer 330 enhances the contact characteristics. Thus, the doping density of the ohmic contact layer 330 may be adjusted between about $10^{13}$ and about $10^{17}$ atom/cm$^3$. The doping density and location may vary depending on a manufacturing process and design. The positive voltage line 310 is disposed along the shaded unit pixels 31 in one direction of the matrix pattern in the active pixel region 10 of FIG. 1. The positive voltage line 310 is connected to the photoelectric converter 110 via the ohmic contact layer 330 and a metal contact 320. According to an embodiment of the present invention, a voltage flowing through the positive voltage line 310 may be the power supply voltage Vdd.

In the operation of the drain, excess electrons generated in the active pixel region 10 by the incident light with high intensity flow to the photoelectric converter 110 of each of the shaded unit pixels 31. The excess electrons that flow into the photoelectric converter 110 are discharged to the outside via the ohmic contact layer 330 and the metal contact 320.

According to an embodiment of the present invention, the drain region 30 is formed by a simple change in a manufacturing process and can provide a stable reference signal. Accordingly, the difference between the image signal Vout provided by the active pixel region 10 and the reference signal provided by the second optical black region 40 becomes large enough to enhance the quality of a reconstructed image.

Figure 6:
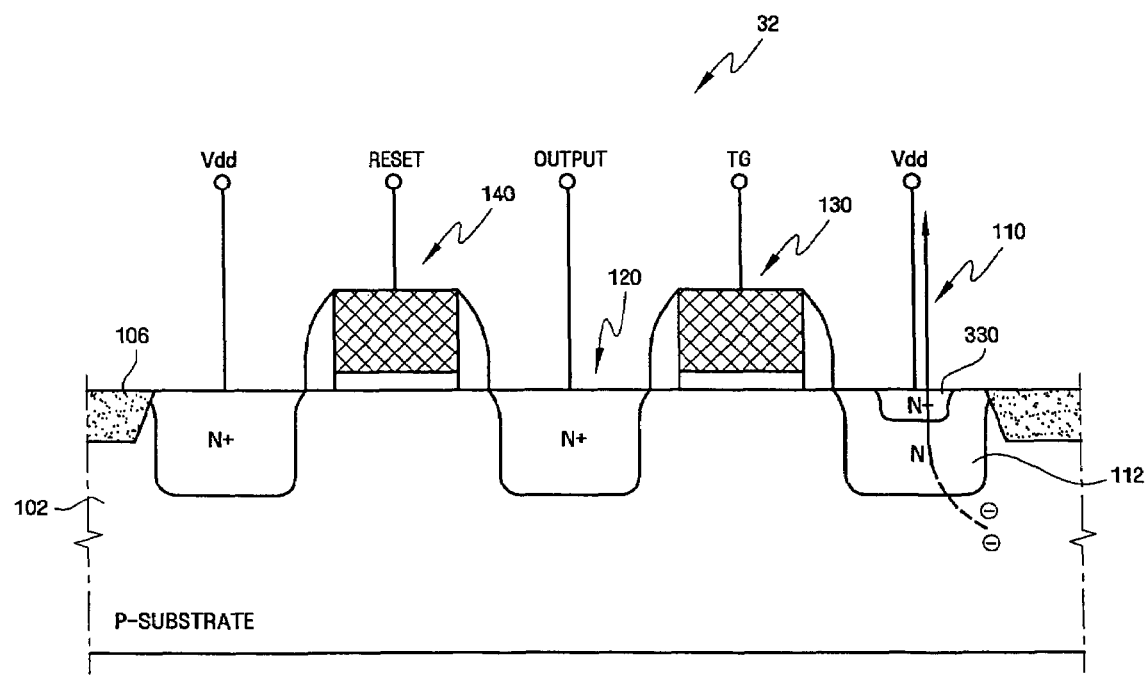
FIG. 6 is a cross-sectional view of an image sensor according to another embodiment of the present invention.

FIG. 6 is a cross-sectional view of an image sensor according to another embodiment of the present invention.

Referring to FIG. 6, a shaded pixel unit 32 of an image sensor according to another embodiment of the present invention includes a photoelectric converter 110 including a photodiode 112 without the pinning layer 114 of FIG. 5. According to an embodiment of the present invention, if the photodiode 112 is formed to be an $n^-$-type or n-type photodiode, an $n^+$-type ohmic contact layer 330 may further be formed to enhance the contact characteristics. According to another embodiment of the present invention, if the photodiode 112 is formed to be an $n^+$-type photodiode, the photodiode 112 may be electrically connected to the positive voltage line 310 of FIG. 4 without using the ohmic contact layer 330.

Figure 7:
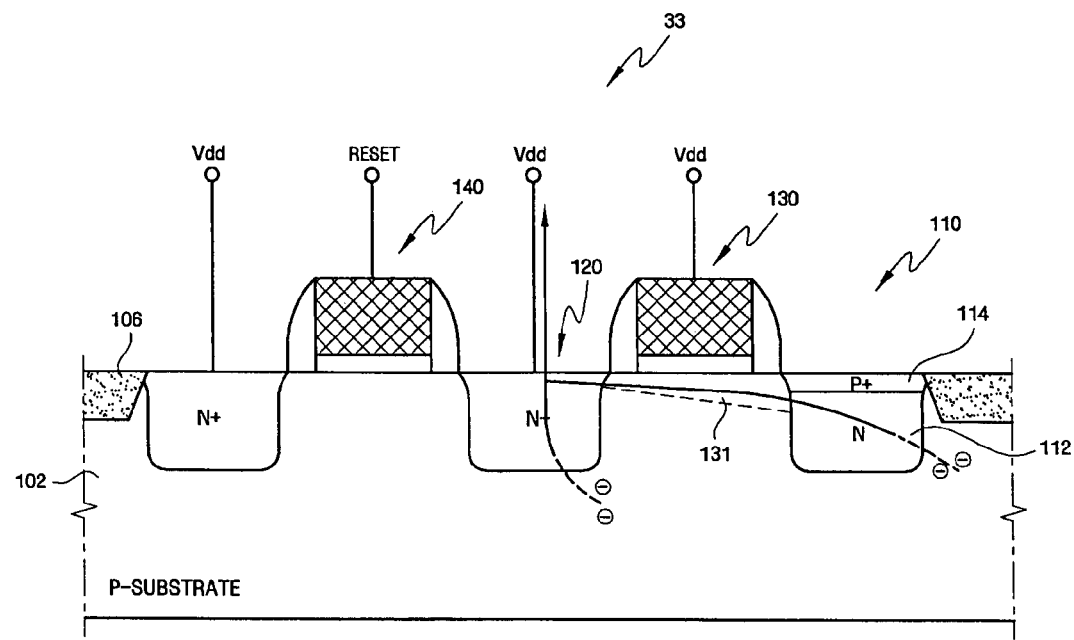
FIG. 7 is a cross-sectional view of an image sensor according to another embodiment of the present invention.

FIG. 7 is a cross-sectional view of an image sensor according to another embodiment of the present invention.

Referring to FIG. 7, a shaded unit pixel 33 of an image sensor includes a charge transmitter 130 and a charge detector 120 electrically connected to a positive voltage line through which a positive voltage is applied. In an embodiment of the present invention, the positive voltage is the power supply voltage Vdd. Alternatively, a positive voltage that is maintained at a constant level may be used. In an embodiment of the present invention, the image sensor includes the charge transmitter 130 and four transistors. Alternatively, the image sensor may include three transistors and not the charge transmitter 130. When three transistors are used, only the charge detector 120 is electrically connected to the positive voltage.

Figure 8A:
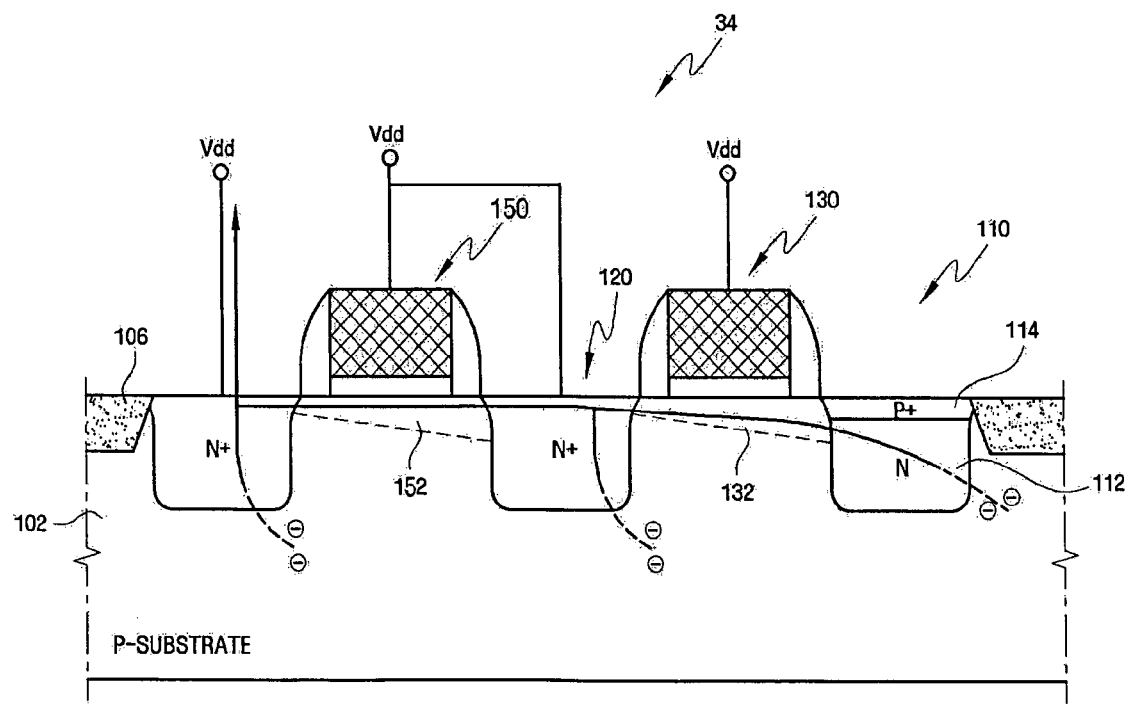
FIG. 8A is a cross-sectional view of an image sensor according to another embodiment of the present invention.
Figure 8B:
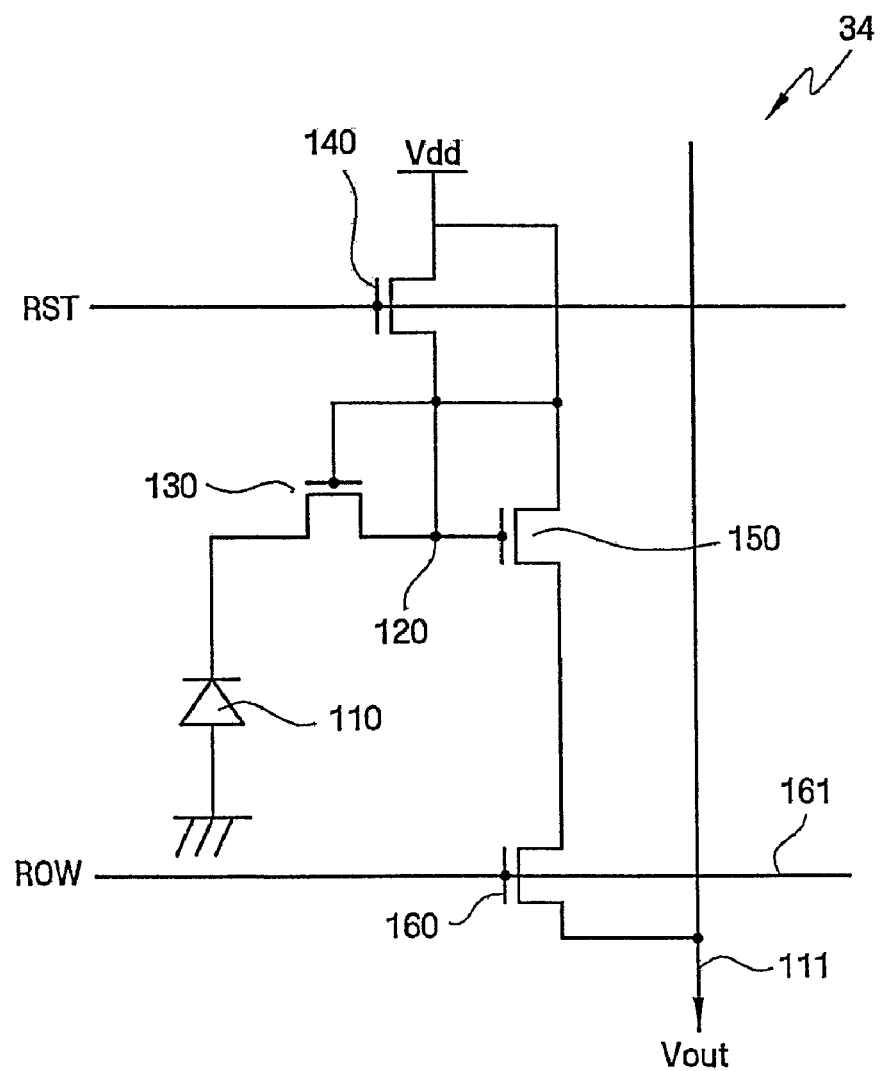
FIG. 8B is a circuit diagram of the image sensor of FIG. 8A.

FIG. 8A is a cross-sectional view of an image sensor according to another embodiment of the present invention. FIG. 8B is a circuit diagram of the image sensor of FIG. 8A.

Referring to FIGS. 8A and 8B, a shaded pixel unit 34 of an image sensor includes a charge transmitter 130 and an amplifier 150. A positive voltage greater than a threshold voltage Vth is applied to both of the charge transmitter 130 and the amplifier 150. In an embodiment of the present invention, the positive voltage may be the power supply voltage Vdd. When the image sensor includes three transistors, the amplifier 150 or the charge detector 120 may be electrically connected to the positive voltage line.

Excess electrons, generated in an active pixel region 10 by high intensity light, flow to a photoelectric converter 110 or a charge detector 120 of each of the shaded unit pixels 34. The excess electrons that flow into the photoelectric converter 110 move to the charge detector 120 through an n-type channel 132 under the charge transmitter 130 connected to the positive voltage or the power supply voltage Vdd. Then, the excess electrons that flow into the charge detector 120 are discharged to the outside through the n-type channel 152. Due to the positive voltage applied to the amplifier 150, an optical black signal voltage is captured in a drain of a selector 160. If selected by a select signal, the selector 160 outputs an optical black signal to a vertical signal line 111.

Figure 9:
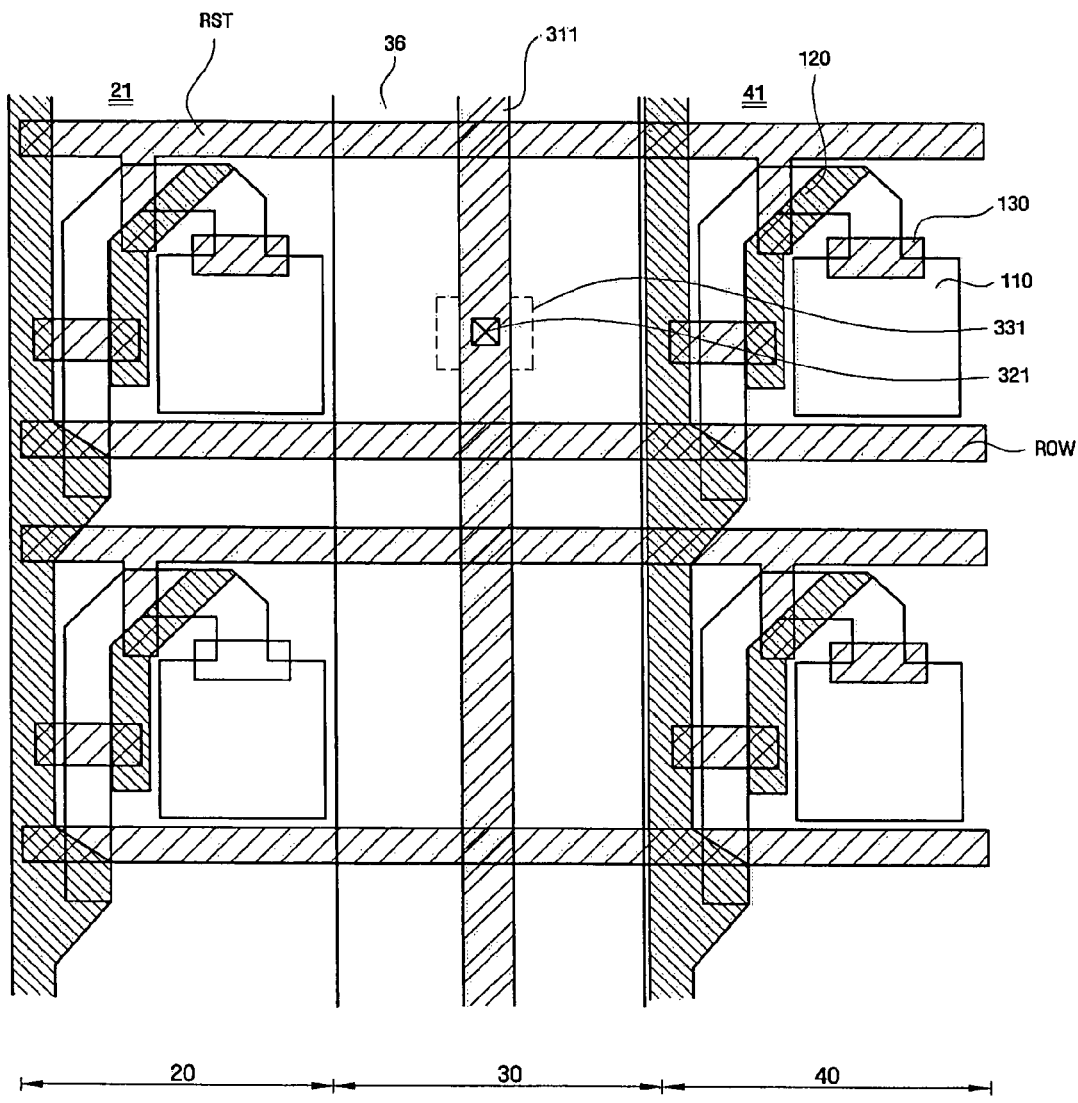
FIG. 9 is a layout diagram for illustrating a drain structure of a portion of an image sensor according to another embodiment of the present invention.

FIG. 9 is a layout diagram of a portion of an image sensor for illustrating a drain structure according to an embodiment of the present invention.

Referring to FIG. 9, a pixel arrangement unit of an image sensor according to another embodiment of the present invention includes the first optical black region 20, the drain region 30, and the second optical black region 40. A plurality of shaded unit pixels 21 and 41 are arranged in the first and second optical black regions 20 and 40, respectively. An n-type impurity region 36 may be formed in the drain region 30 to capture excess electrons. The n-type impurity region 36 is electrically connected to a positive voltage line 311, and an $n^+$-type ohmic contact layer 331 may be formed in the n-type impurity region 36 to enhance the contact characteristics between the n-type impurity region 36 and a metal contact 321.

According to the embodiment as shown in FIG. 9, a drain capability can be enhanced since a unit size in which excess electrons are captured is larger than when the shaded unit pixel 31 is used. Further, the manufacturing process can be simplified, and the second optical black region 40 can provide a stable reference signal. The difference between an image signal provided by the active pixel region 10 and a reference signal provided by the second optical black region 40 becomes large enough to enhance the quality of a reconstructed image.

Figure 10:
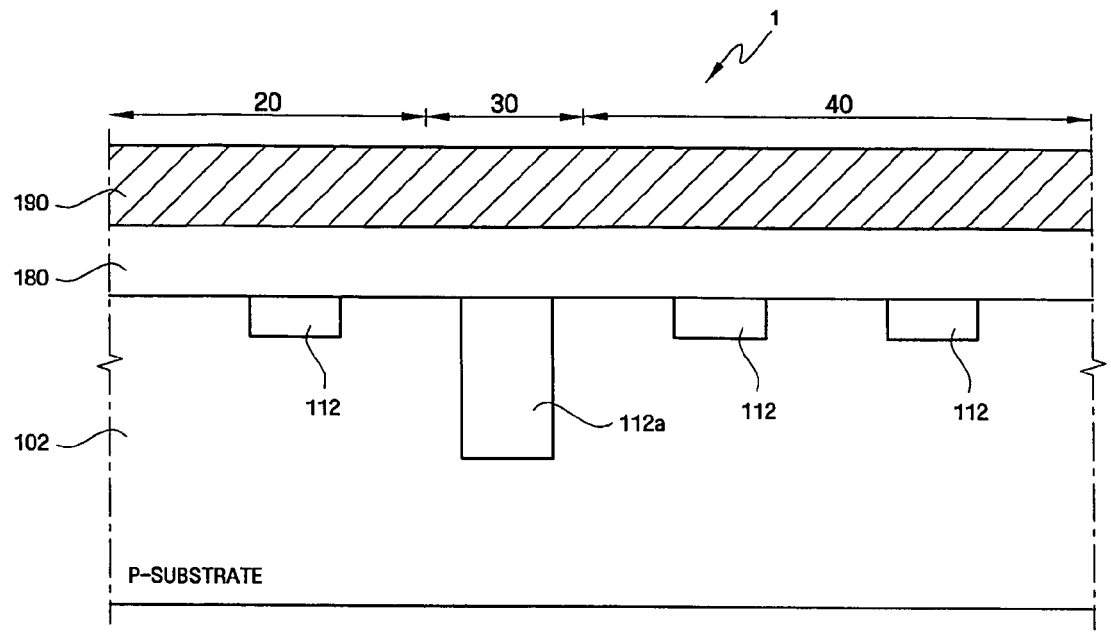
FIGS. 10-13 are cross-sectional views of an image sensor according to embodiments of the present invention.

Referring to FIG. 10, an image sensor according to another embodiment of the present invention includes the active pixel region 10 (see FIG. 1), the first optical black region 20, the drain region 30, and the second optical black region 40 formed on a semiconductor substrate 102. A surface protection layer 180 is formed on the photodiodes 112 and 112a of the shaded unit pixel. A metallic or polysilicon shaded layer 190 is formed on the surface protection layer 180 to prevent light from being incident on the surface protection layer 180.

In an embodiment of the present invention, the photodiode 112a in the drain region 30 is formed deeper than a depth of the photodiode 112 in the first or second optical black region 20 or 40. In this embodiment, electrons formed within the semiconductor substrate 102 as well as excess electrons generated in the active pixel region 10 can be captured in the drain region 30.

The photodiode 112a is formed by ion-implanting the n-type dopants into the semiconductor substrate 102 deeper than when the photodiodes of the active pixel region 10, the first optical black region 20, and the second optical black regions 40 are formed. The ion-implantation may be performed a plurality of times using different levels of energy. The photodiode 112a may be formed deeply by ion-implanting the n-type dopants into the semiconductor substrate 102 sequentially using, for example, 1 MeV, 700 KeV, 500 KeV, and 300 KeV of energy. FIG. 10 illustrates the photodiode 112a formed deeper than other photodiodes 112 and electrically connected to the positive voltage of FIG. 5 or 6 as an example of the drain region 30. Those skilled in the art can readily understand that the fabrication method can be applied to other embodiments of the present invention as illustrated in, for example, FIGS. 7 through 9.

Figure 11:
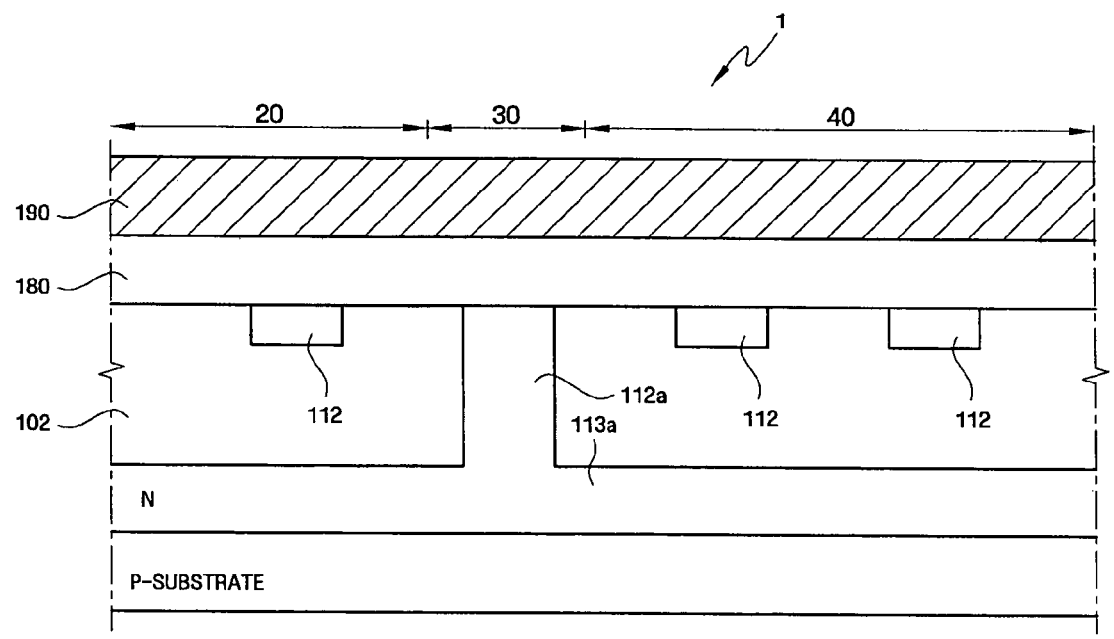

Referring to FIG. 11, the photodiode 112a, formed deeper than photodiodes of adjacent regions such as the active pixel region 10 of FIG. 1, is connected to the active pixel region 10 and to a first lower drain region 113a formed under first and second optical black regions 20 and 40. Therefore, a path through which excess electrons formed in the active pixel region 10 can move to a lower part of the photodiode 112a and reach the second optical black region 40 is blocked.

Due to the drain capability of the first lower drain region 113a, the second optical black region 40 can provide a stable reference signal. Accordingly, the difference between an image signal provided by the active pixel region 10 and the reference signal provided by the second optical black region 40 becomes large enough to enhance the quality of a reconstructed image. The first lower drain region 113a may be formed, for example, by ion-implanting the n-type dopants into a p-type semiconductor substrate 102.

Figure 12:
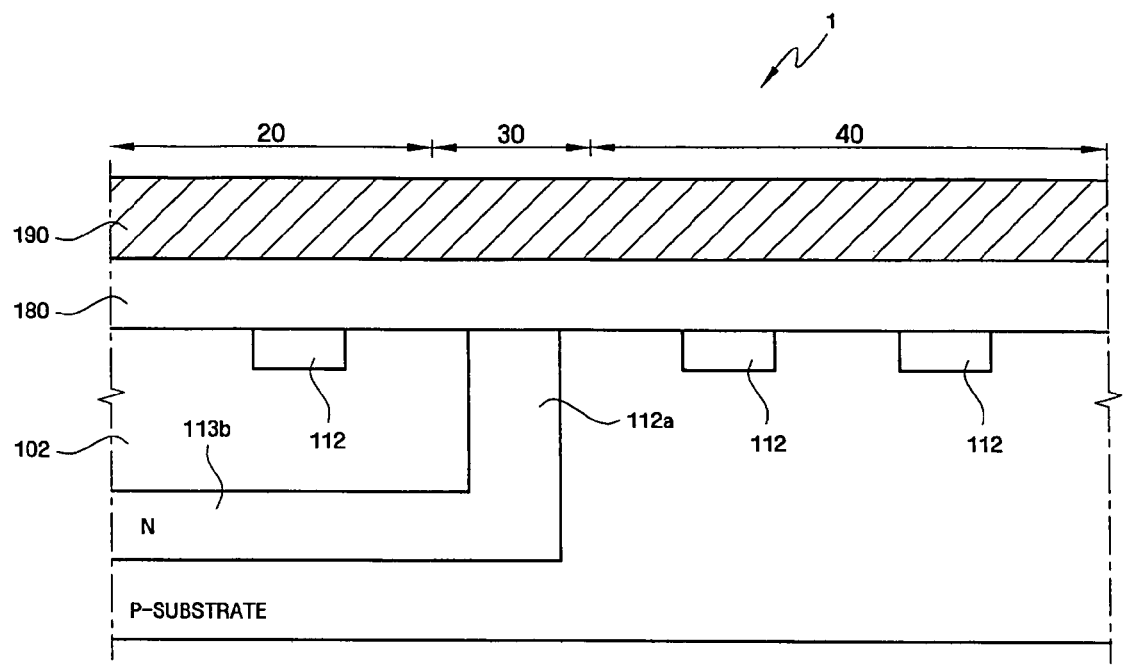
Figure 13:
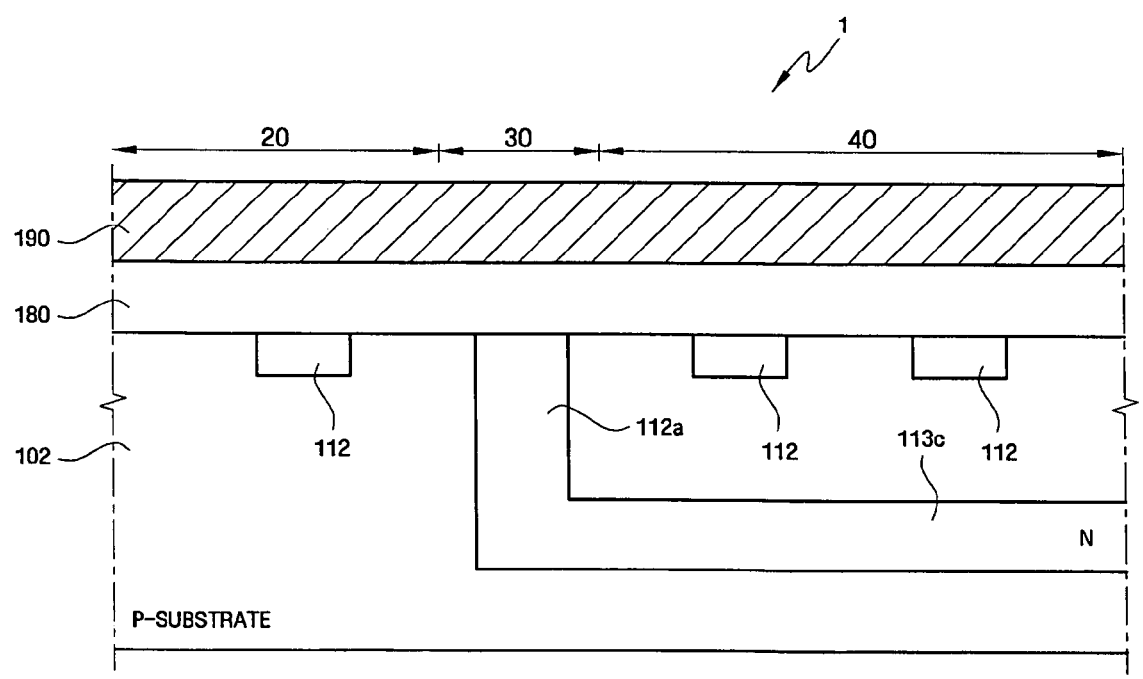

Referring to FIG. 12, the photodiode 112a may be connected to the active pixel region 10 and a second lower drain region 113b formed under the first optical black region 20 according to an embodiment of the present invention. Referring to FIG. 13, a photodiode 112a may be connected to a third lower drain region 113c formed under the second optical black region 40 according to another embodiment of the present invention.

Figure 14A:
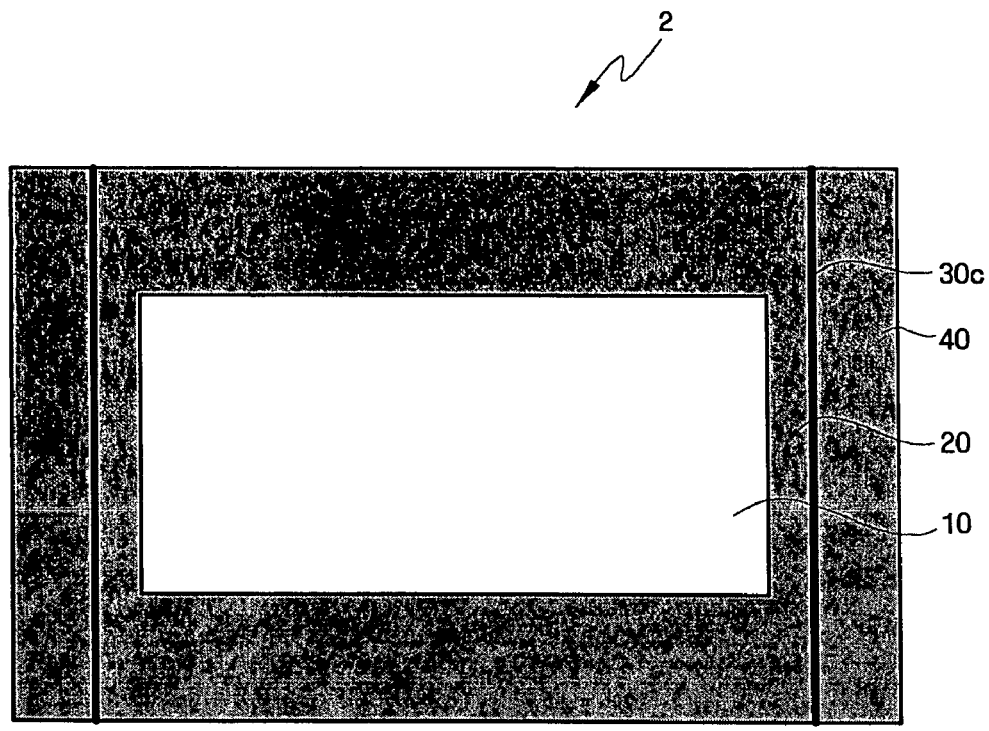
FIGS. 14A and 14B illustrate pixel arrangement units of image sensors according to embodiments of the present invention.
Figure 14B:
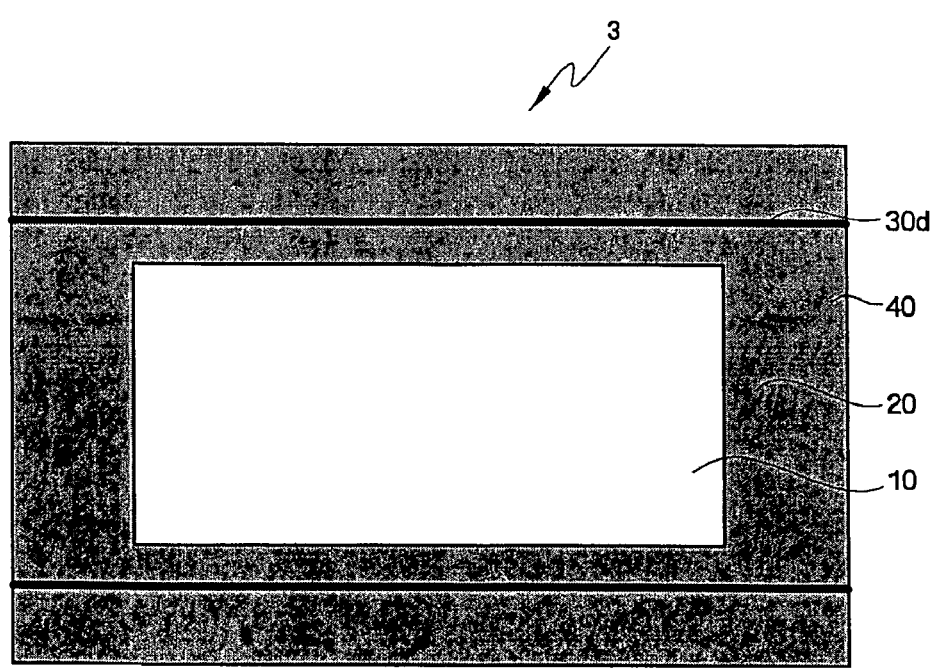

Referring to FIGS. 14A and 14B, drain regions 30c and 30d of pixel arrangement units 2 and 3 of image sensors according to embodiments of the present invention are disposed adjacent to opposite sides of the active pixel regions 10 and are parallel to one direction of the matrix pattern.

A direction to which excess electrons overflow varies depending on the design and manufacturing process of an image sensor. Thus, the drain regions 30c and 30d may have a variety of configurations. For example, if the excess electrons overflow to both sides of the active pixel region 10, the drain regions 30c and 30d may be formed as illustrated in FIGS. 14A and 14B. The drain regions 30c and 30d can be formed as illustrated in FIGS. 4 through 13.

According to embodiments of the present invention, for example, an image sensor can provide a stable reference signal since excess electrons generated by high intensity incident light do not flow to an optical black region, a difference between a voltage level of an image signal and that of a reference signal becomes large enough to enhance the quality of a reconstructed image, excess electrons generated within a semiconductor substrate as well as those generated in an active pixel region can be prevented from flowing to the optical black region, and the characteristics of the excess electrons generated in the active pixel region can be estimated through an analysis of a first optical black region.

Although preferred embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. An image sensor, comprising:
   an active pixel region including a plurality of unit pixels formed on a semiconductor substrate;
   a first optical black region formed adjacent to the active pixel region;
   a drain region formed adjacent to the first optical region; and
   a second optical black region formed adjacent to the drain region,
   wherein the first optical black region produces a signal to analyze a correlation between intensity of incident light received by the active pixel region and excess electrons generated from the active pixel region.

2. An image sensor comprising:
   an active pixel region including a plurality of unit pixels arranged in a matrix pattern;
   a first optical black region formed adjacent to the active pixel region, and including a plurality of first optical black region shaded unit pixels are arranged therein;
   a drain region formed adjacent to the first optical black region, the drain region discharging excess electrons generated in the active pixel region; and
   a second optical black region formed adjacent to the drain region, and including a plurality of second optical black region shaded unit pixels are arranged therein,
   wherein the first optical black region produces a signal to analyze a correlation between intensity of incident light and the excess electrons.

3. The image sensor of claim 2, wherein each unit pixel comprises a photoelectric converter that is formed in a semiconductor substrate and accumulates electric charges corresponding to incident light.

4. The image sensor of claim 2, wherein the first optical black region surrounds the active pixel region, and the drain region surrounds the first optical black region.

5. The image sensor of claim 2, wherein: the drain region comprises a first drain region and a second drain region; the first drain region is parallel to a first direction of the matrix pattern and the second drain region is parallel to a second direction of the matrix pattern; and the second direction is perpendicular to the first direction.

6. The image sensor of claim 5, wherein each of the first and second drain regions includes portions arranged on opposite sides of the matrix pattern.

7. The image sensor of claim 5, wherein an end of the first region is connected to an end of the second drain region.

8. The image sensor of claim 5, wherein the drain region comprises a plurality of drain region shaded unit pixels and a positive voltage is applied to a photoelectric converter formed in each of the drain region shaded unit pixels.

9. The image sensor of claim 8, wherein the photoelectric converter formed in each of the drain region shaded unit pixels comprises an n-type photodiode, a p-type pinning layer formed on the n-type photodiode, and an ohmic contact layer penetrating the pinning layer and connected to the n-type photodiode.

10. The image sensor of claim 8, wherein the photoelectric converter of each of the shaded unit pixels comprises an n-type photodiode and an ohmic contact layer formed on the n-type photodiode.

11. The image sensor of claim 5, wherein the drain region comprises a plurality of drain region shaded unit pixels and a positive voltage is applied to a charge detector formed in each of the shaded unit pixels.

12. The image sensor of claim 11, wherein a positive voltage is applied to a charge transmitter formed in each of the drain region shaded unit pixels.

13. The image sensor of claim 5, wherein the drain region comprises a plurality of drain region shaded unit pixels and a positive voltage is applied to an amplifier formed in each of the drain region shaded unit pixels.

14. The image sensor of claim 13, wherein a positive voltage is applied to a charge transmitter included in each of the drain region shaded unit pixels.

15. The image sensor of claim 5, wherein the drain region is formed on the active pixel region of a semiconductor substrate and the drain region is an n-type impurity region to which a positive voltage is applied.

16. The image sensor of claim 15, wherein the positive voltage is a power supply voltage.

17. The image sensor of claim 5, wherein the drain region is formed deeper than photoelectric converters formed in the active pixel region and in the first or second optical black region.

18. The image sensor of claim 17, wherein the drain region is connected to a first lower drain region formed under the active pixel region, and under the first and second optical black regions.

19. The image sensor of claim 17, wherein the drain region is connected to a second lower drain region formed under the active pixel region and the first optical black region.

20. The image sensor of claim 17, wherein the drain region is connected to a third lower drain region formed under the second optical black region.

21. The image sensor of claim 2, wherein the drain region is disposed adjacent to opposite sides of the active pixel region.

22. The image sensor of claim 21, the drain region comprises a plurality of drain region shaded unit pixels and a positive voltage is applied to a photoelectric converter formed in each of the drain region shaded unit pixels.

23. The image sensor of claim 22, wherein the photoelectric converter formed in each of the drain region shaded unit pixels comprises an n-type photodiode, a p-type pinning layer formed on the n-type photodiode, and an ohmic contact layer penetrating the pinning layer and connected to the n-type photodiode.

24. The image sensor of claim 22, wherein the photoelectric converter of each of the drain region shaded unit pixels comprises an n-type photodiode and an ohmic contact layer formed on the n-type photodiode.

25. The image sensor of claim 21, wherein the drain region comprises a plurality of drain region shaded unit pixels and a positive voltage is applied to a charge detector formed in each of the drain region shaded unit pixels.

26. The image sensor of claim 25, wherein the positive voltage is applied to a charge transmitter formed in each of the drain region shaded unit pixels.

27. The image sensor of claim 21, wherein the drain region comprises a plurality of drain region shaded unit pixels and a positive voltage is applied to a reset portion formed in each of the drain region shaded unit pixels.

28. The image sensor of claim 27, wherein the positive voltage is applied to a charge detector portion formed in each of the drain region shaded unit pixels.

29. The image sensor of claim 21, wherein the drain region is formed on the active region of a semiconductor substrate and is an n-type impurity region to which a positive voltage is applied.

30. The image sensor of claim 29, wherein the positive voltage is a power supply voltage.

31. The image sensor of claim 30, wherein the drain region is formed deeper than the active pixel region and deeper than the first or second optical black region.

32. The image sensor of claim 31, wherein the drain region is connected to a first lower drain region formed under the active pixel region, and under the first and second optical black regions.

33. The image sensor of claim 31, wherein the drain region is connected to a second lower drain region formed under the active pixel region and under the first optical black region.

34. The image sensor of claim 31, wherein the drain region is connected to a third lower drain region formed under the second optical black region.

* * * * *